(12) United States Patent
Ko et al.

(10) Patent No.: US 8,629,056 B2
(45) Date of Patent: Jan. 14, 2014

(54) METHOD FOR FORMING SELF-ASSEMBLED MONO-LAYER LINER FOR CU/POROUS LOW-K INTERCONNECTIONS

(75) Inventors: Chung-Chi Ko, Nantou (TW); Chia-Cheng Chou, Keelung (TW); Keng-Chu Lin, Ping-Tung (TW); Tien-I Bao, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 181 days.

(21) Appl. No.: 13/107,549

(22) Filed: May 13, 2011

(65) Prior Publication Data

US 2011/0217840 A1     Sep. 8, 2011

Related U.S. Application Data

(60) Division of application No. 12/509,039, filed on Jul. 24, 2009, now Pat. No. 7,968,451, which is a continuation of application No. 11/509,498, filed on Aug. 24, 2006, now abandoned.

(60) Provisional application No. 60/809,754, filed on May 31, 2006.

(51) Int. Cl.
*H01L 21/4763* (2006.01)

(52) U.S. Cl.
USPC ........................................................ 438/628

(58) Field of Classification Search
USPC .................................. 438/627, 628
See application file for complete search history.

(56) References Cited

U.S. PATENT DOCUMENTS

| | | | |
|---|---|---|---|
| 6,603,204 B2 | 8/2003 | Gates et al. | |
| 6,620,560 B2 | 9/2003 | Jiang et al. | |
| 6,663,973 B1 * | 12/2003 | Lee et al. | 428/447 |
| 6,677,680 B2 | 1/2004 | Gates et al. | |
| 6,716,742 B2 | 4/2004 | Gates et al. | |
| 6,777,325 B2 | 8/2004 | Ryuzaki et al. | |
| 6,797,633 B2 | 9/2004 | Jiang et al. | |
| 6,831,366 B2 | 12/2004 | Gates et al. | |
| 6,844,266 B2 | 1/2005 | Maex et al. | |
| 6,867,126 B1 | 3/2005 | Li et al. | |
| 6,878,615 B2 | 4/2005 | Tsai et al. | |
| 6,893,985 B2 | 5/2005 | Goodner | |
| 6,917,108 B2 | 7/2005 | Fitzsimmons et al. | |
| 6,919,636 B1 | 7/2005 | Ryan | |
| 7,018,918 B2 * | 3/2006 | Kloster et al. | 438/623 |
| 2004/0214430 A1 | 10/2004 | Ruelke et al. | |

(Continued)

OTHER PUBLICATIONS

Ko, C.C., et al., "Dielectric/TaN Interface Design with Self-Assembled Monolayer Liner for 45nm & Beyond Cu/Porous Low-k Damascene Interconnects," 2006, pp. 224-226, IEEE.

(Continued)

*Primary Examiner* — Jenny L Wagner
(74) *Attorney, Agent, or Firm* — Slater & Matsil, L.L.P.

(57) ABSTRACT

A method for fabricating an integrated circuit comprises forming a low-k dielectric layer over a semiconductor substrate, etching the low-k dielectric layer to form an opening, and treating the low-k dielectric layer with a gaseous organic chemical to cause a reaction between the low-k dielectric layer and the gaseous organic chemical. The gaseous organic chemical is free from silicon.

19 Claims, 3 Drawing Sheets

(56) References Cited

U.S. PATENT DOCUMENTS

| | | |
|---|---|---|
| 2004/0224494 A1 | 11/2004 | Clevenger et al. |
| 2005/0048795 A1* | 3/2005 | Ko et al. ............ 438/778 |
| 2005/0239278 A1* | 10/2005 | Li et al. ............ 438/618 |
| 2006/0027929 A1 | 2/2006 | Cooney, III et al. |
| 2006/0099802 A1 | 5/2006 | Lin et al. |
| 2006/0154464 A1 | 7/2006 | Higashi |
| 2006/0216932 A1 | 9/2006 | Kumar et al. |
| 2007/0032068 A1 | 2/2007 | Ogawa |
| 2007/0082132 A1 | 4/2007 | Shinriki et al. |
| 2007/0096321 A1 | 5/2007 | Raaijmakers et al. |
| 2007/0284746 A1 | 12/2007 | Lopatin et al. |

OTHER PUBLICATIONS

Wolf, S., et al., "Chemical Vapor Deposition of Amorphous and Polycrystalline Thin Films," Silicon Processing for the VLSI Era, 1986, pp. 161-175, vol. 1. Lattice Press, Sunset Beach, CA.

* cited by examiner

METHOD FOR FORMING SELF-ASSEMBLED MONO-LAYER LINER FOR CU/POROUS LOW-K INTERCONNECTIONS

This application is a divisional of U.S. patent application Ser. No. 12/509,039, filed on Jul. 24, 2009, and entitled "Method for Forming Self-Assembled Mono-Layer Liner for Cu/Porous Low-k Interconnections," which is a continuation of U.S. patent application Ser. No. 11/509,498, filed on Aug. 24, 2006, and entitled "Self-Assembled Mono-Layer Liner for Cu/Porous Low-k Interconnections," which claims the benefit of U.S. Provisional Patent Application Ser. No. 60/809,754, filed on May 31, 2006, and entitled "Self-Assembled Mono-Layer Liner for Cu/Porous Low-k Interconnections;" the above applications are hereby incorporated herein by reference in their entireties.

TECHNICAL FIELD

This invention relates generally to integrated circuits, and more particularly to the design and formation methods of interconnect structures of the integrated circuits.

BACKGROUND

As the semiconductor industry introduces new generations of integrated circuits (IC's) having higher performance and greater functionality, the density of the elements that form the integrated circuits is increased, and the dimensions, sizes and spacings between the individual components or elements are reduced. While in the past such reductions were limited only by the ability to define the structures photo-lithographically, device geometries having even smaller dimensions created new limiting factors. For example, for any two adjacent conductive paths, as the distance between the conductors decreases, the resulting capacitance (a function of the dielectric constant (k) of the insulating material divided by the distance between conductive paths) increases. This increased capacitance results in increased capacitive coupling between the conductors, increased power consumption, and an increase in the resistive-capacitive (RC) time constant. Therefore, continual improvement in semiconductor IC performance and functionality is dependent upon developing materials that form a dielectric film with a lower dielectric constant (k) than that of the most commonly used material, silicon oxide, in order to reduce capacitance. As the dimensions of these devices get smaller and smaller, significant reduction in capacitance into the so-called "ultra low-k" regime is required.

New materials with low dielectric constants (known in the art as "low-k dielectrics") are being investigated for use as insulators in semiconductor chip designs. A low dielectric constant material helps to enable further reductions in the integrated circuit feature dimensions. In conventional IC processing, $SiO_2$ was used as a basis for the dielectric material, resulting in a dielectric constant of about 3.9. Advanced low-k dielectric materials have dielectric constants below about 2.7. The substance with the lowest dielectric constant is air (k=1.0). Therefore, porous dielectrics are very promising candidates, since they have the potential to provide very low dielectric constants.

However, porous films have shortcomings. Poor time-dependent dielectric breakdown (TDDB) performance has become a severe problem as a result of the seriously deteriorated barrier integrity. FIG. 1 illustrates a conventional interconnection formation scheme. A first copper line 4 is formed in a low-k dielectric layer 2. An etch stop layer 5 is formed on low-k dielectric layer 2. A second copper line 12 is electrically coupled to copper line 4 through a via 14. The second copper line 12 and via 14 are formed in a porous low-k dielectric layer 6. A diffusion barrier layer 10 is formed over sidewalls of the trench opening and via opening, in which copper is filled to form second copper line 12 and via 14. As low-k dielectric layer 6 is porous, the material in diffusion barrier layer 10 may penetrate into pores that are exposed on sidewalls of the via opening and trench opening, thus causing clouding effects, which will adversely affect the subsequent interconnection formation processes. To solve this problem, a dielectric pore sealing layer 8 is formed on exposed surfaces of low-k dielectric layer 6 in the trench and via openings to seal the pores. Dielectric pore sealing layer 8, however, typically has a higher k value than low-k dielectric layer 6 has. The RC delay in the interconnect structure is thus increased. In addition, the adhesion of dielectric pore sealing layer 8 and diffusion barrier layer 10 is not satisfactory, and delamination may occur in the subsequent chemical mechanical polish process. Furthermore, dielectric pore sealing layer 8 is not conductive, and thus the portion on an interface 16, which is exposed through the via opening, needs to be removed by an additional liner removal step.

Accordingly, a method that maximizes the benefit of low-k dielectrics while reducing the effects of their porous properties is needed.

SUMMARY OF THE INVENTION

In accordance with an aspect of the present invention, a method for fabricating an integrated circuit comprises forming a low-k dielectric layer over a semiconductor substrate, etching the low-k dielectric layer to form an opening, and treating the low-k dielectric layer with a gaseous organic chemical to cause a reaction between the low-k dielectric layer and the gaseous organic chemical. The gaseous organic chemical is free from silicon.

In accordance with yet another aspect of the present invention, a method for fabricating an integrated circuit comprises forming a low-k dielectric layer over a semiconductor substrate, etching the low-k dielectric layer to form an opening, and treating the low-k dielectric layer with an organic chemical free from silicon. A molecular weight of the organic chemical is greater than about 60 g/mole.

In accordance with yet another aspect of the present invention, a method for forming an integrated circuit comprises forming a dielectric layer comprising porogen material, curing the dielectric layer to remove the porogen material to create pores in the dielectric layer, etching an opening in the dielectric layer, exposing the dielectric layer to an organic gas to form a thin sealant layer in the opening on a sidewall of the dielectric layer, and forming a metal in the opening.

The advantageous features of the present invention include a reduced effect of RC delay, improved adhesion between the pore sealing layer and the diffusion barrier layer, and a saved liner removal step.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a low-k dielectric layer and a corresponding interconnect structure is provided. The intermediate stages for manufacturing the preferred embodiment of the present invention are illustrated. Variations of the preferred embodiments are then discussed. Throughout the various views and illustrative embodiments of the present invention, like reference numbers are used to designate like elements.

Figure 1:
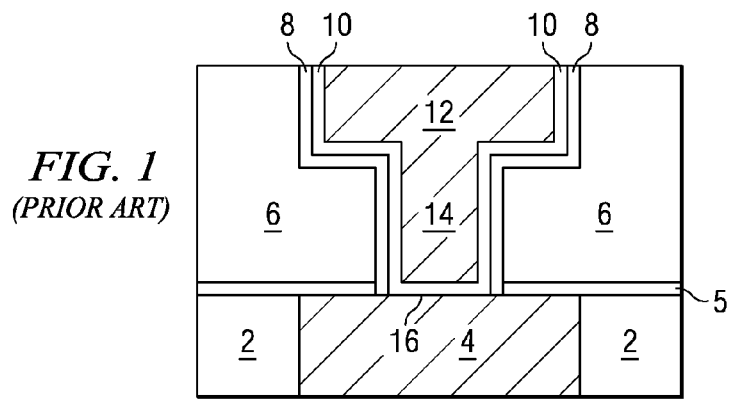
FIG. 1 illustrates a conventional interconnect structure including a low-k dielectric material.
Figure 2:
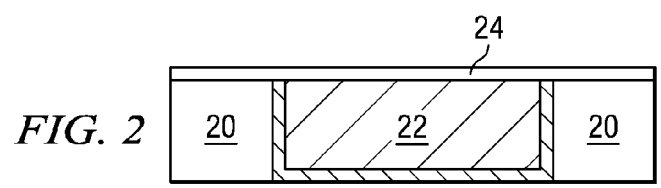
FIGS. 2 through 7 are cross-sectional views of intermediate stages in the manufacture of a preferred interconnect structure, wherein a dual damascene process is illustrated.

FIG. 2 illustrates a starting structure having a conductive line 22 formed in a dielectric layer 20. Conductive line 22 and dielectric layer 20 are over a semiconductor substrate (not shown), which is preferably a silicon substrate having semiconductor devices formed thereon. Conductive line 22 is preferably a metal line comprising copper, tungsten, aluminum, silver, gold, alloys thereof, compounds thereof, and combinations thereof. Conductive line 22 is typically connected to another underlying feature (not shown), such as a via or a contact plug. Dielectric layer 20 may be an inter-layer dielectric (ILD) layer or an inter-metal dielectric (IMD) layer, and preferably has a low k value.

An etch stop layer (ESL) 24 is formed on dielectric layer 20 and conductive line 22. Preferably, ESL 24 comprises nitrides, silicon-carbon based materials, carbon-doped oxides, and combinations thereof. The preferred formation method is plasma enhanced chemical vapor deposition (PECVD). However, other commonly used methods such as high-density plasma CVD (HDPCVD), atomic layer CVD (ALCVD), and the like can also be used. In an exemplary embodiment wherein ESL 24 comprises silicon nitride or silicon carbide, the formation is preferably performed in a chamber, in which gaseous precursors such as silane ($SiH_4$) and ammonia ($NH_3$) are introduced and a chemical reaction occurs.

In alternative embodiments, dielectric layer 24 is a diffusion barrier layer preventing undesirable elements, such as copper, from diffusing into the subsequently formed low-k dielectric layer. In a more preferred embodiment, dielectric layer 24 acts as both an etch stop layer and a diffusion barrier layer.

Figure 3:
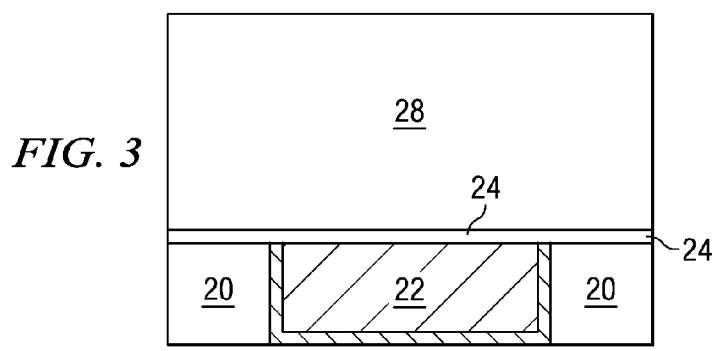

FIG. 3 illustrates the formation of a low-k dielectric layer 28, which provides insulation between conductive line 22 and overlying conductive lines that will be formed subsequently. Accordingly, low-k dielectric layer 28 is sometimes referred to as an inter-metal dielectric (IMD) layer.

Low-k dielectric layer 28 preferably has a dielectric constant (k) value of lower than about 3.5, and more preferably lower than about 2.5. The preferred materials include carbon-containing materials, organo-silicate glass, porogen-containing materials, and combinations thereof. Low-k dielectric layer 28 may be deposited using a chemical vapor deposition (CVD) method, preferably plasma enhanced CVD (PECVD), although other commonly used deposition methods, such as low pressure CVD (LPCVD), atomic layer chemical vapor deposition (ALCVD), and spin-on, can also be used.

A first treatment, which preferably includes a curing process, is then performed. The curing process can be performed using commonly used curing methods, such as ultraviolet (UV) curing, eBeam curing, thermal curing, and the like, and may be performed in a production tool that is also used for PECVD, atomic layer deposition (ALD), LPCVD, etc. In an exemplary UV curing process, an ultraviolet radiator tool is utilized. The exemplary process conditions include a temperature of between about 250° C. and about 450° C., a curing power of between about 3000 W and about 6000 W, and a curing time of between about 300 seconds and about 1500 seconds. The curing may be performed in a vacuum environment or in an environment containing process gases such as $H_2$, $N_2$, inert gases (including He, Ne, Ar, Kr, Xe, Rn), and combinations thereof. The wavelength of the UV curing is preferably between about 200 nm and about 400 nm.

The treatment serves the function of driving porogen out of low-k dielectric layer 28, thus improving its mechanical property. Pores will then be generated in low-k dielectric layer 28. In the preferred embodiment, after the treatment, the porosity of low-k dielectric layer 28 is preferably greater than about 15%.

Figure 4:
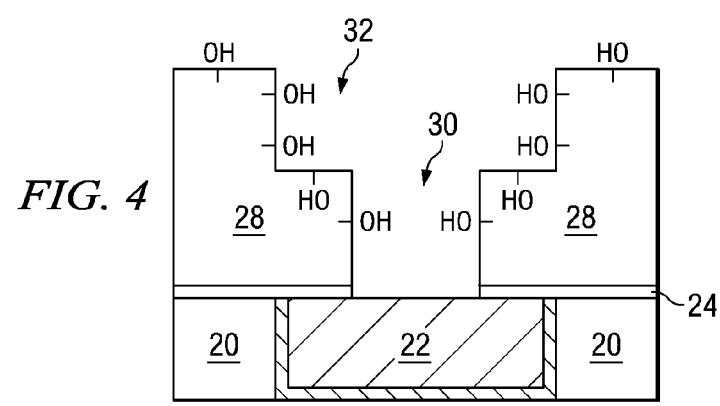

FIG. 4 illustrates the formation of a via opening 30 and a trench opening 32 in low-k dielectric layer 28. Photo resists (not shown) are formed and patterned over low-k dielectric layer 28 to aid in the formation of via opening 30 and trench opening 32. In the preferred embodiment, an anisotropic etch cuts through low-k dielectric layer 28 and stops at ESL 24, thereby forming a via opening 30. Trench opening 32 is then formed. Since there is no etch stop layer for stopping the etching of trench opening 32, etching time is controlled so that the etching of the trench opening 32 stops at a desired depth. In alternative embodiments, a trench-first approach is taken, in which trench opening 32 is formed prior to the formation of via opening 30. ESL 24 is then etched through via opening 30, exposing underlying conductive line 22.

In alternative embodiments, the previously discussed low-k dielectric layer 28 may be replaced by a first low-k dielectric layer, an ESL on the first low-k dielectric layer, and a second low-k dielectric layer on the ESL. The ESL is used for etching trench opening 32. One skilled in the art will realize the appropriate process steps.

In the preferred embodiment, low-k dielectric layer 28 contains silicon, oxygen and carbon. Carbon may be present in the form of methyl, ethyl, propyl, and the like. The low-k dielectric material may be schematically represented as PLK-Si—O—$CH_3$, wherein PLK represents a portion of the porous low-k dielectric material in low-k dielectric layer 28. The etching process, however, typically causes the depletion of carbon from low-k dielectric layer 28, particularly on the surface of openings 30 and 32. As a result, a surface portion of the respective low-k dielectric layer 28 may be represented by PLK-Si—O~, wherein the symbol "~" indicates dangling bonds. As such dangling bonds are not stable, they can easily form bonds with hydrogen to form OH terminals, and the resulting material on the surface of the low-k dielectric layer 28 is schematically represented by PLK-Si—OH. FIG. 4 schematically illustrates such OH terminals on the exposed surfaces of low-k dielectric layer 28.

Figure 5:
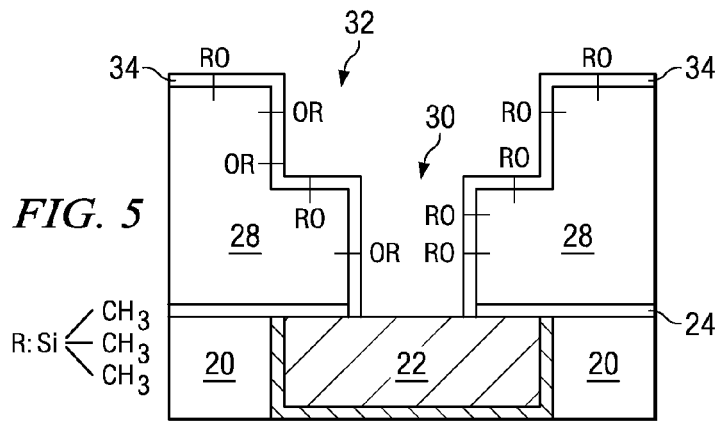

Referring to FIG. 5, a self-assembled mono-layer (SAM) formation process is performed to treat the exposed surfaces of low-k dielectric layer 28. In the preferred embodiment, the SAM formation process is performed using plasma-assisted treating processes. Alternatively, thermal treating processes are used. The process gases preferably include an organic chemical containing methyl, ethyl, and/or propyl groups. More preferably, the organic chemical includes a methyl-containing gas. The organic chemical also preferably contains nitrogen, and/or a ring-type structure with benzene rings, and is preferably free from silicon. The molecular weight of the organic chemical is preferably greater than about 60 g/mole. In addition, carrier gases such as inert gases, nitrogen, hydrogen, ammonia, and combinations thereof are used. The organic chemical reacts with the surface portion of the porous low-k dielectric material, which is represented as PLK-Si—OH. The reaction causes the bonds between oxygen and hydrogen to break, and the hydrogen ions are replaced by methyl, ethyl, and/or propyl groups. The methyl, ethyl, and/or propyl groups are terminals, and thus the resulting material on the surface of exposed low-k dielectric layer 28 stops growing after the terminals are attached, resulting in a substantial mono-layer, which is denoted as layer 34. It should be noted that on the surface of the exposed copper line 22, there are substantially no OH terminals, and thus the mono-layer 34 (SAM 34) is substantially not formed on copper line 22. Accordingly, such a process is self-assembled, hence the name self-assembled mono-layer (SAM) process. Also the deposition process will stop after the terminals are formed, thus SAM 34 is very thin. In an exemplary embodiment, SAM 34 has a thickness of less than about 50 Å, and is more likely between about 10 Å and 30 Å. In an analysis of a sample that generated a Time-of-Flight Secondary Ion Mass Spectrometry (ToF-SIMS) positive ion spectra, the presence of methyl group terminals on the surface of low-k dielectric layer 28 has been observed.

Due to the formation of carbon-containing terminal groups, there is a high carbon concentration in a surface layer of low-k dielectric layer 28. The concentration in the surface layer tends to be greater than in inner portions of low-k dielectric layer 28. In an exemplary embodiment, a surface layer with a thickness of 30 Å has a first average carbon concentration higher than a second average carbon concentration of an underlying portion with a thickness of 30 Å. In another exemplary embodiment, the first average carbon concentration is greater than the second average carbon concentration by about three to about 15 percent. This is contrary to the prior art interconnect structure, wherein the carbon concentration of the surface layer is typically lower than in inner portions due to carbon depletion. As methyl, ethyl, and propyl have greater volumes than hydrogen, the pores on the surface of low-k dielectric layer 28 are at least partially sealed.

An exemplary reaction equation is symbolically illustrated below. Please note that this equation is only an example, and should not be used to limit the scope of the present invention:

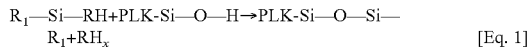
[Eq. 1]

wherein $R_1$ may be $(CH_3)_3$, and R may be a functional group containing nitrogen, and/or a ring-type structure with benzene rings, and $R_1$ is methyl, ethyl, and/or propyl groups. An example of the above-expression is:

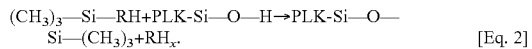
[Eq. 2]

FIG. 5 illustrates a resulting structure after the SAM process. As previously noted, the mono-layer is illustrated as layer 34. It is to be noted, however, that SAM 34 is so thin that it may not be visible, and the existence of SAM 34 may need to be determined using equipment such as time-of-flight secondary ion mass spectrometry (ToF-SIMS).

An optional UV curing is then performed on the structure shown in FIG. 5. In the preferred embodiment, the UV curing may be performed in a production tool with the presence of hydrogen, nitrogen, inert gases, and combinations thereof. The preferred wavelength of the UV light is preferably between about 200 nm and about 400 nm. The exemplary process conditions include a temperature of between about 250° C. and about 450° C., a curing power of between about 3000 W and about 6000 W, and a curing time of about 300 seconds to about 1500 s seconds.

Figure 6:
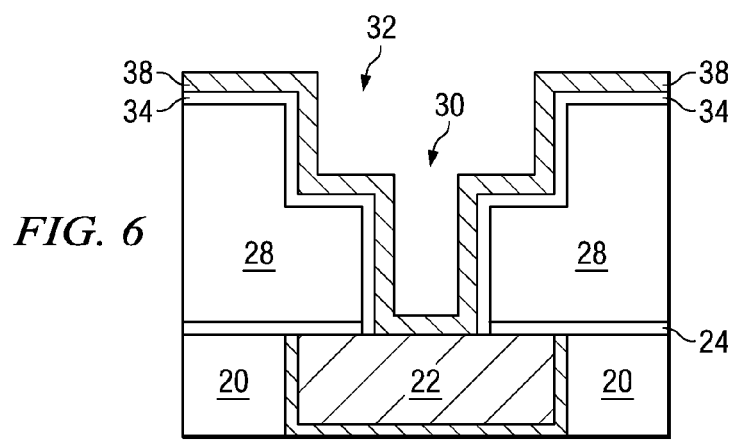

FIG. 6 illustrates the formation of a barrier layer 38, which prevents copper from diffusing into low-k dielectric layer 28 and is preferably formed of a material comprising titanium, titanium nitride, tantalum, tantalum nitride, and the like. It may be a single layer or have a composite structure. As the pores on the surface of low-k dielectric layer 28 are at least partially sealed, the clouding effects, which cause the atoms of the diffusion barrier layer to penetrate into pores, is reduced. In an exemplary embodiment, the atoms of the diffusion barrier layer penetrating into the SAM 34 are so few that the atomic percentage of diffusion materials in SAM 34 is less than about 0.1%.

Figure 7:
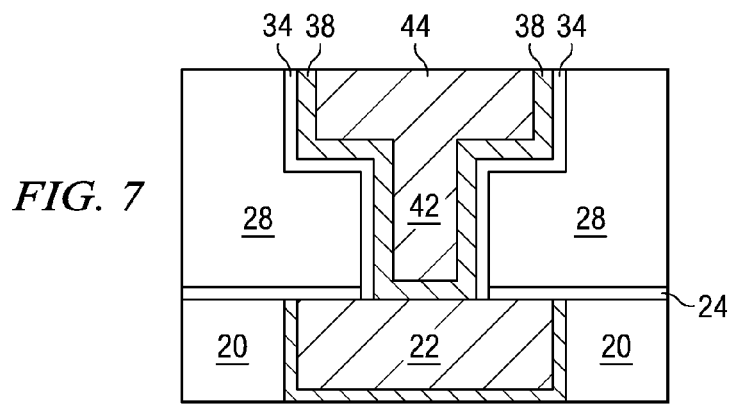

Referring to FIG. 7, via opening 30 and trench opening 32 are filled with a conductive material, preferably copper or copper alloys. However, other metals and metal alloys such as aluminum, tungsten, silver and gold can also be used. A chemical mechanical polish is then performed to level the surface, forming a via 42 and a metal line 44.

Figure 8:
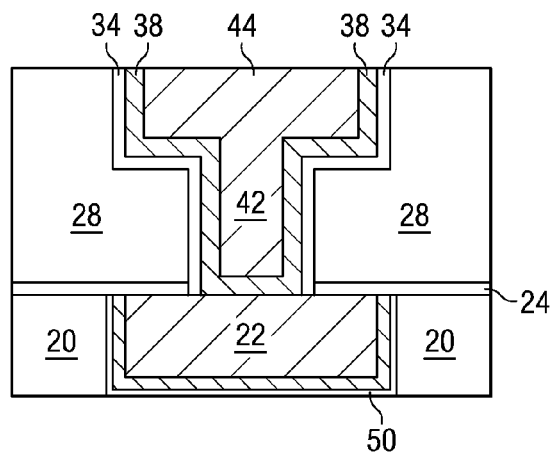
FIG. 8 illustrates a cross-sectional view of a single damascene structure in addition to the structure in FIG. 7.

The previously discussed embodiment illustrates the formation of a dual damascene structure. SAMs can also be formed for single damascene structures. FIG. 8 illustrates a SAM 50 formed in a single damascene structure. One skilled in the art will realize the respective process steps.

Due to the formation of SAM 34, the mechanical and electrical properties of interconnect structures are improved. SAM 34 has better adhesion to the diffusion barrier layer than the conventional pore-sealing layer had, and thus delamination is reduced. As SAM 34 will not be formed on copper line 22, the liner removal step used in conventional processes to remove the dielectric pore-sealing layer on the copper line is saved.

Figure 9:
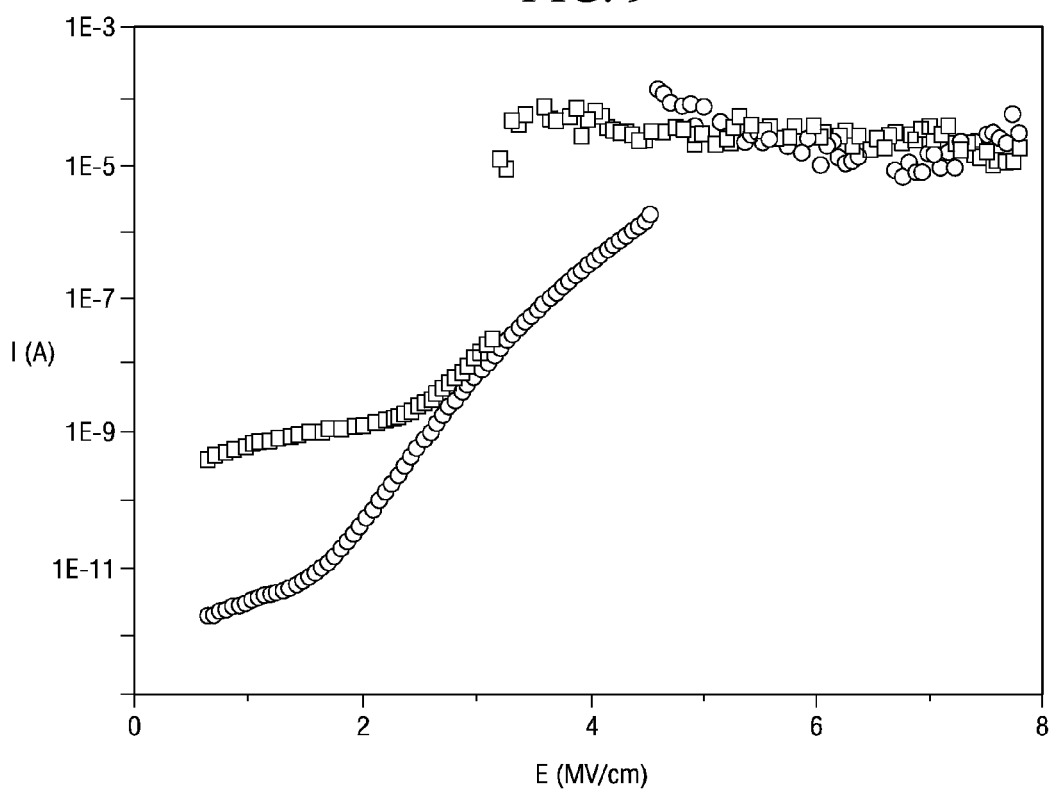
FIG. 9 illustrates a comparison of breakdown electrical fields of a preferred interconnect structure embodiment and a conventional interconnect structure embodiment.

Furthermore, by using the preferred embodiment of the present invention, electrical properties of the interconnect structures are improved. FIG. 9 illustrates a comparison of a preferred interconnect structure formed with a SAM and a conventional interconnect structure with a barrier layer formed directly on a low-k dielectric layer. The data obtained from the preferred embodiment are shown as hollow circles, while data obtained from the conventional interconnect structure are shown as solid squares. It is observed that the breakdown electrical field of the preferred interconnect structure is about twice the breakdown electrical field of the conventional interconnect structure. In addition, since SAM is very thin, the RC delay caused by SAM is substantially eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit, the method comprising:
    forming a dielectric layer comprising porogen material;
    removing the porogen material to create pores in the dielectric layer;
    after removing the porogen material, forming a recess in the dielectric layer;
    forming a thin sealant layer in the recess on a sidewall of the dielectric layer by reacting the dielectric layer with an organic gas to modify a portion of the dielectric layer; and
    forming a conductive material in the recess.

2. The method of claim 1, wherein the removing the porogen material comprises curing the dielectric layer.

3. The method of claim 1, wherein the pores in the dielectric layer collectively comprise greater than 15 percent of the dielectric layer by volume.

4. The method of claim 1, wherein the organic gas comprises methyl, ethyl, propyl groups or a combination thereof.

5. The method of claim 1, wherein the organic gas comprises nitrogen or a ring-type structure with benzene rings.

6. The method of claim 1, wherein the organic gas is free from silicon.

7. The method of claim 1, wherein the organic gas comprises a chemical with a molecular weight of greater than 60 g/mole.

8. The method of claim 1, wherein the thin sealant layer is a mono-layer.

9. A method for forming an integrated circuit, the method comprising:
    forming a dielectric layer comprising porogen material and a first material;
    removing the porogen material to create pores in the dielectric layer by curing the dielectric layer;
    etching an opening in the dielectric layer, the dielectric layer comprising the first material during the etching the opening;
    forming a thin sealant layer in the opening on a sidewall of the dielectric layer by reacting the first material of the dielectric layer with an organic gas; and
    forming a metal in the opening.

10. The method of claim 9, wherein the curing the dielectric comprises ultra-violet (UV) curing, eBeam curing, or thermal curing.

11. The method of claim 10, wherein the curing comprises the UV curing, the UV curing comprising a temperature of between 250° C. and 450° C., a curing power of between 3000 W and 6000 W, and a curing time of between 300 seconds and 1500 seconds.

12. The method of claim 9, wherein the pores in the dielectric layer collectively comprise greater than 15 percent of the dielectric layer by volume.

13. The method of claim 9, wherein the organic gas comprises methyl, ethyl, propyl groups or a combination thereof.

14. The method of claim 9, wherein the organic gas comprises nitrogen or a ring-type structure with benzene rings.

15. The method of claim 9, wherein the forming the thin sealant layer further comprises using inert gases, nitrogen, hydrogen, ammonia, or a combination thereof.

16. The method of claim 9 further comprising ultra-violet (UV) curing after exposing the dielectric to the organic gas.

17. The method of claim 9, wherein the organic gas is free from silicon.

18. The method of claim 9, wherein the organic gas comprises a chemical with a molecular weight of greater than 60 g/mole.

19. The method of claim 9 further comprising forming a barrier layer in the opening.

* * * * *